United States Patent [19]

Kondoh et al.

[11] Patent Number: 5,235,222
[45] Date of Patent: Aug. 10, 1993

[54] OUTPUT CIRCUIT AND INTERFACE SYSTEM COMPRISING THE SAME

[75] Inventors: Harufusa Kondoh; Hiromi Notani, both of Hyogo, Japan

[73] Assignee: Mitsubishi Denki Kabushiki Kaisha, Tokyo, Japan

[21] Appl. No.: 813,627

[22] Filed: Dec. 26, 1991

[30] Foreign Application Priority Data

Apr. 4, 1991 [JP] Japan .................................. 3-017802

[51] Int. Cl.$^5$ .......................................... H03K 19/0185
[52] U.S. Cl. ..................................... 307/475; 307/443; 307/296.8
[58] Field of Search ............ 307/443, 451, 475, 296.8, 307/270, 575, 577, 584, 581; 323/312, 315, 316

[56] References Cited

U.S. PATENT DOCUMENTS

| | | | |
|---|---|---|---|
| 4,074,150 | 2/1978 | Buckley, III et al. | 307/443 |
| 4,251,743 | 2/1981 | Hareyama | 323/316 |
| 4,791,326 | 12/1988 | Vajdic et al. | 307/451 |
| 4,864,216 | 9/1989 | Kalata et al. | 323/315 |
| 4,912,347 | 3/1990 | Morris | 307/443 |
| 5,019,728 | 5/1991 | Sanwo et al. | 307/443 |
| 5,030,855 | 7/1991 | Leung | 307/475 |

OTHER PUBLICATIONS

Mavor et al., *Introduction to MOS LSI Design*, chapter 6.14, "Output circuits" ©1983 by Addison-Wesley Publishers Limited.

Song and Gray, "A Precision Curvature-Compensated CMOS Bandgap Reference," IEEE Journal of Solid-State Circuits, vol. SC-18, No. 6, (Dec. 1983), pp. 634-643.

*Primary Examiner*—David R. Hudspeth
*Assistant Examiner*—Benjamin D. Driscoll
*Attorney, Agent, or Firm*—Lowe, Price, LeBlanc & Becker

[57] ABSTRACT

An output circuit 1 comprises a constant current source 11, a switch 12, and an output pad 14. The switch 12 is connected between the constant current source 11 and the output pad 14. A transmission path 3 is connected to the output pad 14. The transmission path 3 is coupled to a terminator voltage $V_{TT}$ by a resistor for pull up. Reflection of a signal or generation of noise can be suppressed by bringing the resistance value of the resistor 4 close to a characteristic impedance of the transmission path 3. A voltage amplitude on the transmission path 3 can be determined arbitrarily by adjusting current value of the constant current source 11 and resistance value of the resistor 4.

14 Claims, 7 Drawing Sheets

OUTPUT CIRCUIT AND INTERFACE SYSTEM COMPRISING THE SAME

BACKGROUND OF THE INVENTION

1. Field of the Invention

The invention relates generally to output circuits and interface systems comprising the same and, more particularly, to output circuits driving a load in response to an applied signal and interface systems comprising the same.

2. Description of the Background Art

FIG. 7 is a diagram showing a conventional output circuit included in a semiconductor integrated circuit device (referred to as CMOSIC hereinafter) comprising a CMOS circuit. The output circuit 100 is a CMOS inverter type output circuit (a driver).

The output circuit 100 comprises N channel MOS transistors 101 and 102, inverters 103, 104, and 105 and an output pad 106. Driving capability of the inverters 103, 104, and 105 respectively, is increased according to the order. A capacitive load 107 outside the IC is connected to an output pad 106. As shown in FIG. 8, each of the inverters 103, 104, and 105 comprise a P channel MOS transistor 108 and an N channel MOS transistor 109.

Generally, the capacitive load is assumed to be the load of these CMOS inverter type output circuits (referred to as the CMOS output circuit hereinafter) for the following reasons.

(1) Usually, the CMOSIC is connected as a load in the CMOS output circuit. In the input circuit of the CMOSIC, the current such as a base current in a TTL (Transistor-Transistor Logic) circuit does not flow. Therefore, an input impedance of the CMOSIC is equivalent to the capacity.

(2) The input circuit of the CMOSIC connected to the CMOS output circuit is assumed to receive a voltage of 5 V amplitude. Thus, generally in the CMOS output circuit, a low level $V_{OL}$ of the output signal is determined to be 0 V, and a high level $V_{OH}$ of the output signal is determined to be 5 V. As shown in FIG. 9, it is assumed that the load connected to the output pad 106 comprises a resistive load 111. In this case, when the transistor 108 in the output circuit 100 (see FIG. 8) turns on, a potential $V_L$ of a node nL is represented by the next equation:

$$V_L = R_L \cdot V_{DD}/(R_{ON} + R_L)$$

where, $R_{ON}$ is on resistance value, $V_{DD}$ is resistance value of the power supply potential, and $R_L$ is resistance value of the resistive load 111.

In this manner, the output voltage of the output circuit 100 changes dependent on resistance value $R_{ON}$ of the transistor included in the output circuit 100 and on resistance value $R_L$ of the resistive load 111.

Transistors have various on resistance values due to various conditions during manufacturing. Therefore, when resistive load is connected to the CMOS output circuit, the output voltage may have various values. In addition, the output voltage having the amplitude of 5 V can not be obtained.

For the reasons mentioned above, the resistive load is not connected to a conventional CMOS output circuit, and the interface between the CMOSICs does not comprise the resistive load.

As mentioned above, there is no resistive load connected to the conventional CMOS output circuit. Thus, the interface between the CMOSICs is in a high impedance state, and therefore it is easily influenced by noises from other signals.

In addition, as shown in FIG. 10, let us assume that the output circuit 100 and the input circuit 120 are connected through a transmission path 130. If the impedance of the transmission path is 50Ω, and the terminal resistance of resistance value 50Ω is connected to the end of the transmission path 130, impedance match can be obtained between the transmission path 130 and the input circuit 120. However, for the reasons mentioned above, since the resistive load is not connected to the CMOS output circuit, impedance match is not obtained between the transmission path 130 and the input circuit 120. Therefore, reflection of the signal is likely to occur, and high speed transmission of 50 MHz or higher is difficult to attain.

SUMMARY OF THE INVENTION

One object of the present invention is to provide an output circuit which can drive a low impedance load stably, and which is capable of high speed signal transmission, and to provide an operating method thereof.

Another object of the present invention is to provide the output circuit which can stably drive the low impedance load including a resistive load, and which is capable of high speed signal transmission with less power consumption.

Another object of the present invention is to provide an interface system having low impedance which is capable of high speed signal transmission.

Yet another object is to provide the interface system which is capable of high speed signal transmission with few reflection of signals and few noise.

The output circuit in accordance with the present invention includes an output pad to which a load is connected, a constant current source supplying a constant current, and a switch. The switch is provided between the output pad and the constant current source, and it is selectively rendered conductive or nonconductive in response to an applied signal.

The switch may include a first field effect element having a control terminal which receives a signal. Preferably, the output circuit further includes a second field effect element. The second field effect element is connected between the output pad and the first field effect element, and has a control terminal which receives a prescribed potential.

In the output circuit, when the switch is selectively rendered conductive or nonconductive state in response to the applied signal, the current supplied to the load by the constant current source is modulated. As a result, a voltage corresponding to the current appears across the load. Since it is technically possible to eliminate fluctuation of the current supplied by the constant current source, the resistive load can be stably driven by the output circuit. Consequently, it becomes possible to decrease the impedance of the interface as well as to obtain impedance matching by connecting the resistive load to the output pad.

In this manner, the output circuit which can drive the resistive load stably and which is capable of high speed signal transmission with less reflection and less noise is obtained.

The interface system, in accordance with another aspect of the present invention, includes an output circuit, an input circuit, a transmission path connected between the input circuit and the output circuit, and a resistor coupled between the transmission path and a prescribed potential. The output circuit includes a constant current source and a switch. The switch is provided between the output pad and the constant current source and it is selectively rendered conductive or non-conductive state in response to an applied signal.

The input circuit may include an input pad connected to the transmission path, a reference potential generating circuit which generates a prescribed reference potential, and a differential amplifier. The differential amplifier amplifies a potential difference between the potential of the input pad and the reference potential generated by the reference potential generating circuit.

A prescribed power supply voltage is applied to the output circuit, and preferably, the amplitude of the voltage of the output pad is set lower than the power supply voltage.

In the interface system, since the output circuit of the present invention is provided, and the resistor is coupled between the transmission path and a prescribed potential, the impedance decreases, and impedance matching can be obtained.

When the input circuit includes the differential amplifier which amplifies the potential difference between the potential of the input pad and the reference potential, it transmits a signal with a small amplitude from the output circuit to the input circuit through the transmission path.

In particular, if the amplitude of the voltage of the output pad is set lower than the power supply voltage, power consumption can be decreased.

In this manner, the interface system with less reflection of the signal and less noise, and which is capable of high speed transmission is obtained.

In addition, arbitrary voltage amplitude can be obtained by adjusting current value of the constant current source and resistance value of the resistor. Therefore, power consumption can be decreased by setting the amplitude smaller.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
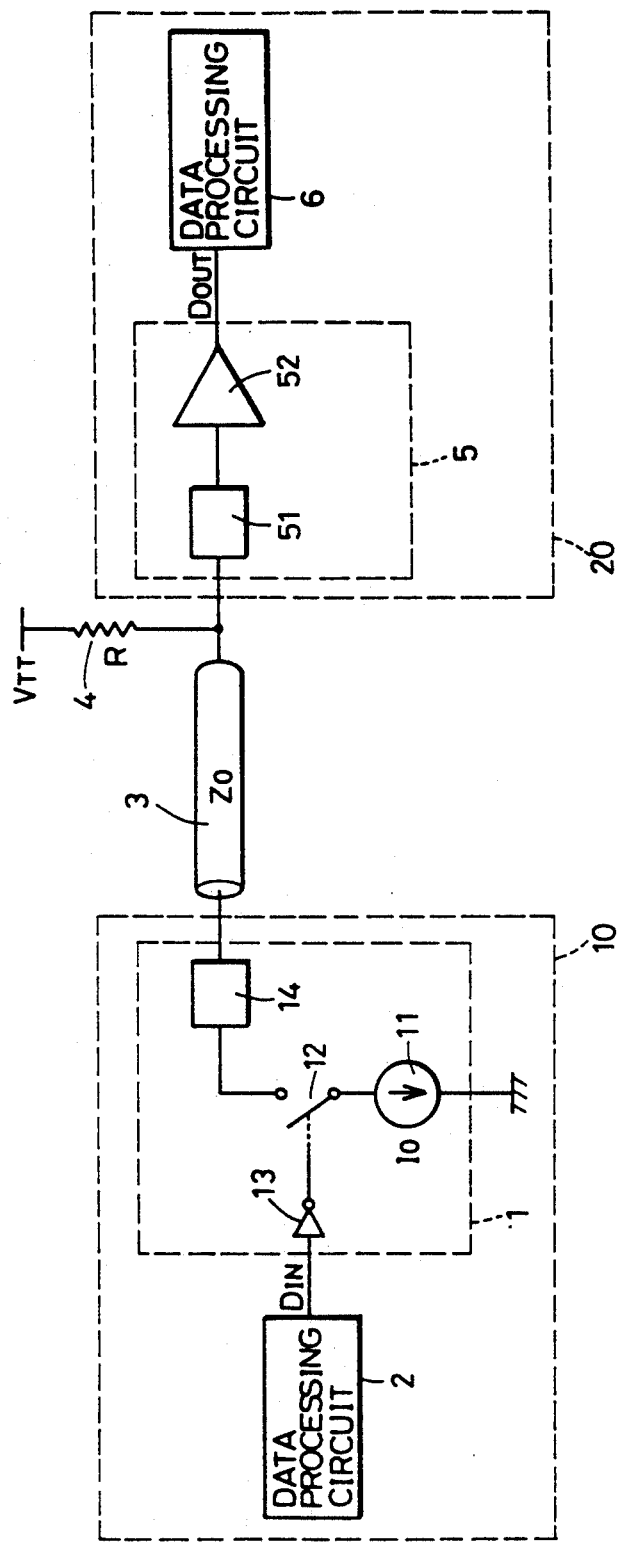
FIG. 1 is a diagram showing the construction of an interface system in accordance with one embodiment of the present invention.

In FIG. 1, an output side IC 10 and an input side IC 20 are connected through a transmission path 3. The output side IC 10 comprises an output circuit 1 and a data processing circuit 2. The input side IC 20 comprises an input circuit 5 and a data processing circuit 6. The transmission path 3 has a characteristic impedance $Z_0$. The terminator of the transmission path 3 is coupled to a prescribed pull up potential (terminator potential) $V_{TT}$ through a resistor for pull up (terminator resistor) 4 having resistance value R.

An output circuit 1 comprises a constant current source 11 supplying a current $I_0$, a switch 12, an inverter 13, and an output pad 14. The switch 12 is connected between the output pad 14 and the constant current source 11 to be controlled by the output signal of the inverter 13. The transmission path 3 is connected to the output pad 14. Data $D_{IN}$ is applied to the inverter 13 from the data processing circuit 2. Respective elements of the output circuit 1 are formed on the same substrate.

The input circuit 5 comprises an input pad 51 and an amplifier 52. The transmission path 3 is connected to the input pad 51. Data $D_{OUT}$ provided from the amplifier 52 is applied to a data processing circuit 6.

The operation of the interface system in FIG. 1 will be described.

The switch 12 turns on or turns off in response to data $D_{IN}$ provided from the data processing circuit 2. When the switch 12 turns on, the current $I_0$ flows into the resistor 4, the transmission path 3, the output pad 14, the switch 12, and the constant current source 11. Consequently, a potential difference $RI_0$ is produced across of the resistor 4 to be applied to the amplifier 52 through the input pad 51. The amplifier 52 amplifies the potential difference and applies it to the data processing circuit 6 as data $D_{OUT}$.

In the interface system in accordance with the embodiment, reflection of the signal and the generation of the noise can be suppressed by bringing resistance value of the resistor 4 close to the characteristic impedance $Z_0$. Also, by adjusting current value of the constant current source 11 or resistance value of the resistor 4, the voltage amplitude on the transmission path 3 can be arbitrarily determined.

Figure 2:
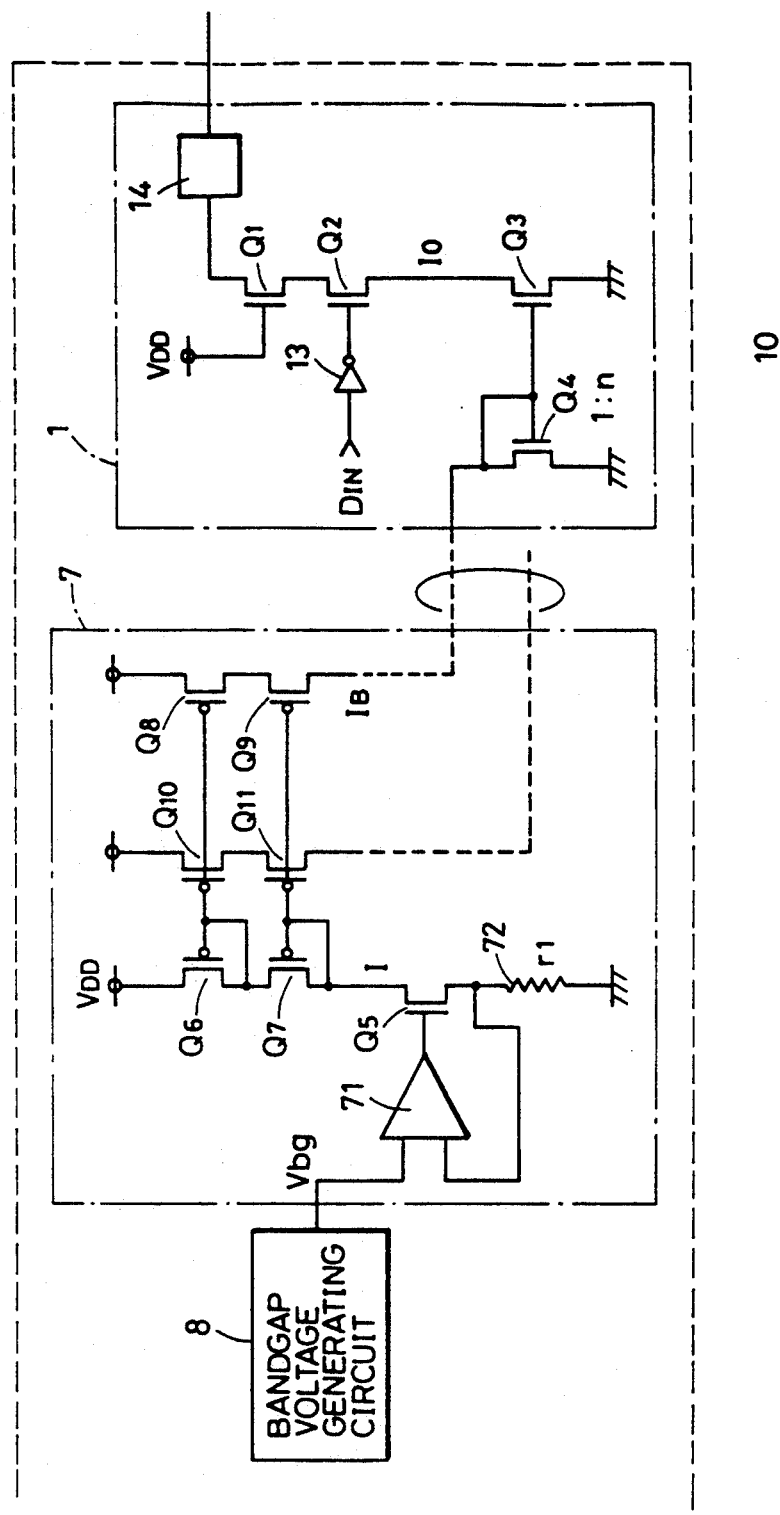
FIG. 2 is a circuit diagram showing a detailed construction of the output circuit.

FIG. 2 shows the detailed construction of the main part of the output side IC 10.

The output circuit 1 comprises N channel MOS transistors Q1, Q2, Q3, and Q4, the inverter 13, and the output pad 14. The power supply potential $V_{DD}$ is applied to the gate of the transistor Q1. Transistors Q3, Q4 constitute a current mirror circuit. The output of the inverter 13 is provided to the gate of the transistor Q2. The transistor Q2 corresponds to the switch 12 in FIG. 1, and the transistor Q3 corresponds to the constant current source 11 in FIG. 1.

A bias current is supplied from a bias current generating circuit 7 to the output circuit 1. The bias current generating circuit 7 comprises an N channel MOS transistor Q5, P channel MOS transistors Q6–Q11, and an operational amplifier 71. A bandgap voltage (constant voltage) $V_{bg}$ is applied to one input terminal of the operational amplifier 71 by a well known bandgap voltage generating circuit 8. For example, the bandgap voltage generating circuit is disclosed in, IEEE Journal of Solid-State Circuits Vol. sc-18, No. 6, December 1983, pp. 634–643 "A precision curvature—Compensated CMOS Bandgap Reference" by Bang-Sup Song and Paul R. Gray. The bandgap voltage $V_{bg}$ is approximately equal to 1.27 V. The other input terminal of the operational amplifier 71 is connected to a source of the transistor Q5 and one terminal of the resistor 72. The other end of the resistor 72 is grounded. The output of the differential amplifier 71 is applied to the gate of the transistor Q5.

A pair of transistors Q6, Q7 and a pair of transistors Q8, Q9 constitute a current mirror circuit, and a pair of transistors Q6, Q7 and a pair of transistors Q10, Q11 constitute another current mirror circuit. Therefore, the current flowing in transistors Q6 and Q7 is respectively mirrored to be output. The mirrored current which is applied to the drain of the transistor Q9 is applied to the transistor Q4 of the output circuit 1 as a bias current.

Generally, a plurality of output circuits are provided in the output side IC 10. Therefore, the current mirrored to the drain of the transistor Q11 is applied to other output circuits as a bias current. Pairs of current mirror circuits are included corresponding to a plurality of output circuits.

The operation of the circuit in FIG. 2 will be described.

Since the output of the operational amplifier 71 is fedback, it is imaginarily shorted between the two input terminals of the operational amplifier 71. Thus, the bandgap voltage $V_{bg}$ is applied across the resistor 72 by the function of the operational amplifier 71, so that the current I represented by the next equation flows in the transistor Q5:

$$I = V_{bg}/r1$$

where, r1 is resistance value of the resistor 72. The bandgap voltage $V_{bg}$ is determined as an accurate value (1.27 V). The resistor 72 has various r1 resistance values due to various conditions during manufacturing. However, resistance value r1 of the resistor 72 can be adjusted by trimming. Alternatively, a prescribed resistance value can be obtained by utilizing the resistor attached outside as the resistor 72. Consequently, current value I can be determined precisely as a prescribed value.

The current flowing in the transistor Q5 is mirrored to the drain of the transistor Q9 by the current mirror circuit comprising transistors Q6, Q7, Q8, and Q9. It is further mirrored to the transistor Q3 by the current mirror circuit comprising transistors Q3, Q4. In this manner, the constant current $I_0$ flows in the transistor Q3.

Figure 3:
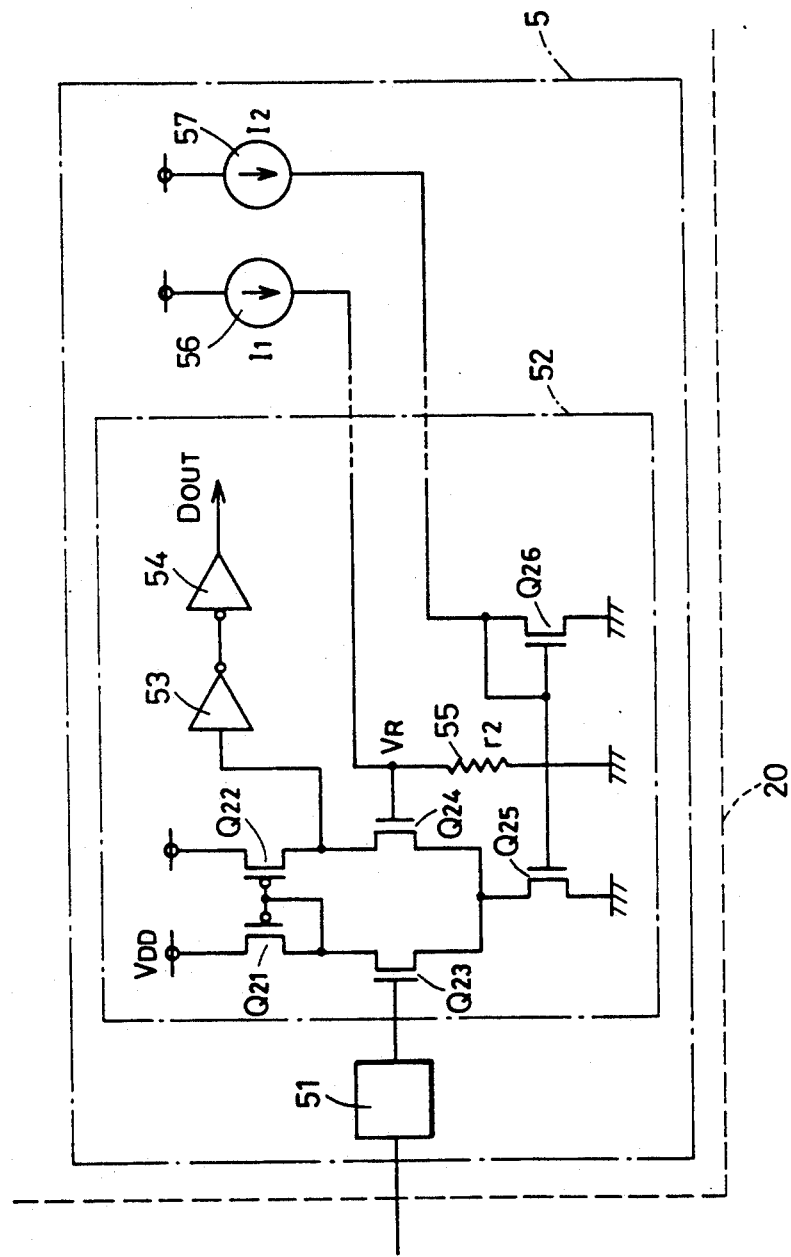
FIG. 3 is a circuit diagram showing the detailed construction of the input circuit.

FIG. 3 shows a detailed construction of the main part of the input side IC 20.

The input circuit 5 comprises an input pad 51, an amplifier 52, and constant current sources 56, 57. Current sources 56, 57 supply constant current I1, I2, respectively. The amplifier 52 comprises P channel MOS transistors Q21, Q22, N channel MOS transistors Q23–Q26, inverters 53, 54, and a resistor 55. Transistors Q21–Q24 constitute a differential amplifier. In addition, transistors Q25, Q26 constitute the current mirror circuit.

The operation of the circuit of FIG. 3 will be described. The reference potential $V_R$ represented by the next equation is applied to the gate of the transistor Q24:

$$V_R = r2 \cdot I1$$

where, r2 is resistance value of the resistor 55. The potential of the input pad 51 is compared with the reference potential $V_R$ by the differential amplifier comprising transistors Q21–Q24, and the potential difference is amplified to be applied to the inverter 53. Inverters 53, 54 work as a buffer to provide the applied potential difference to the data processing circuit 6 (see FIG. 1) as data Dout.

Figure 4:
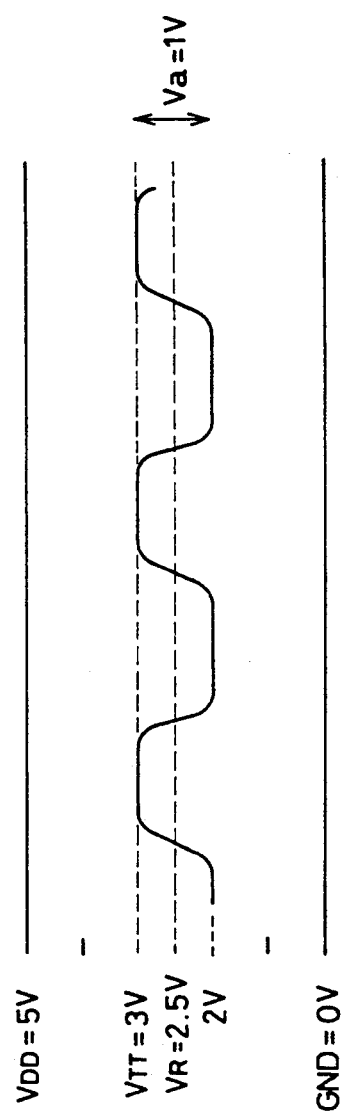
FIG. 4 is a diagram showing a voltage level in the interface system of the same embodiment.

FIG. 4 shows one example of voltage level on the transmission path 3. In the example of FIG. 4, the pull up potential $V_{TT}$ of the resistor 4 in FIG. 1 is set to 3 V, the power supply potential $V_{DD}$ is set to 5 V, ground potential GND is set to 0 V, and the voltage amplitude Va on the transmission path 3 is set to 1 V. If resistance value R of the resistor 4 is set to 100Ω, for example, current value $I_0$ of the constant current source 11 is determined by the next equation:

$$I_0 = V_a/R = 1[V]/100[\Omega] = 10[mA]$$

Accordingly, a constant current source 11 is designed to supply 10 mA current. In this case, if 1:100 is selected as mirror ratio 1:n of the current mirror circuit comprising transistors Q3, Q4 in FIG. 2, bias current value $I_B$ flowing in transistors Q8, Q9 is determined by next equation:

$$I_B = 10[mA]/100 = 100[\mu A]$$

Since the bandgap voltage $V_{bg}$ is approximately equal to 1.27 V (the bandgap voltage of the silicon), resistance value r1 of the resistor 72 is determined by next equation:

$$r1 = V_{bg}/I_B = 1.27[V]/100[\mu A] = 12.7[k\Omega]$$

Therefore, resistance value r1 of the resistor 72 is set to 12.7 kΩ.

The reference potential $V_R$ in FIG. 3 is set to 2.5 V because the voltage on the transmission path 3 changes between 2 V and 3 V. If current value I1 of the current source 56 is set to 100 μA, for example, resistance value r of the resistor 55 is set to 25 kΩ.

Figure 5:
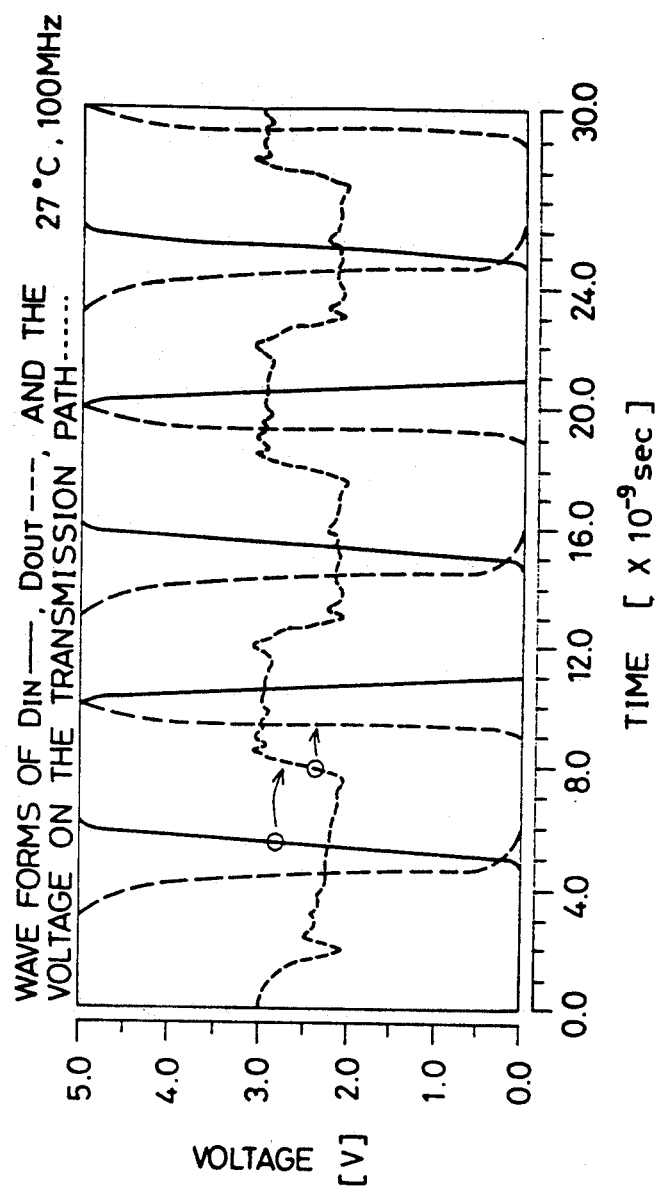
FIG. 5 is a diagram showing a circuit simulation waveform of the voltage in the interface system of the same embodiment.
Figure 6:
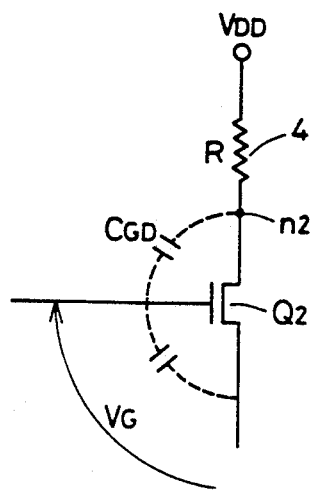
FIG. 6 is the diagram for describing a Miller effect of the transistor.
Figure 7:
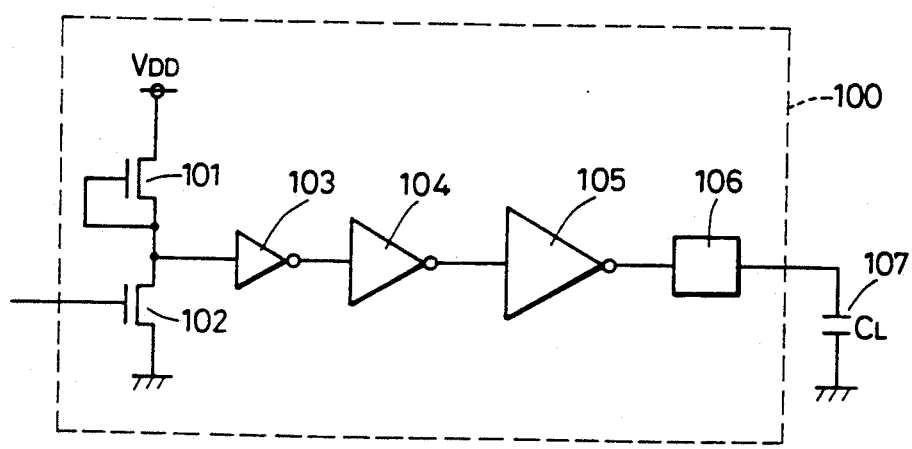
FIG. 7 is a diagram showing one example of a conventional CMOS output circuit.
Figure 8:
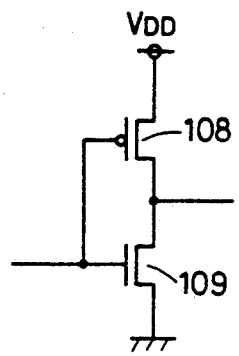
FIG. 8 is a circuit diagram showing the construction of the inverter.
Figure 9:
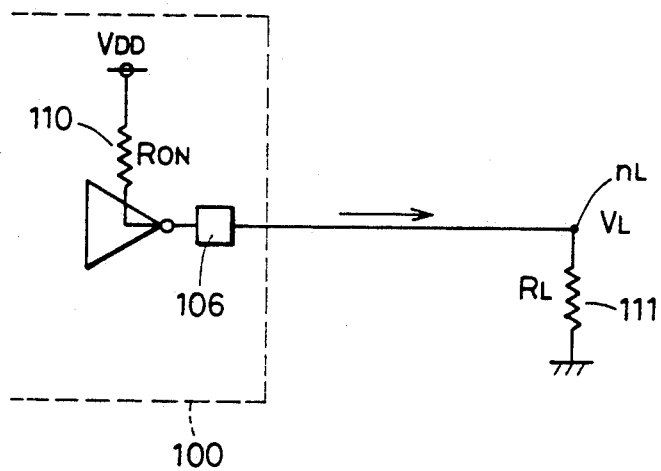
FIG. 9 is a diagram for describing the difficulties caused when the resistive load is connected to the conventional CMOS output circuit.
Figure 10:
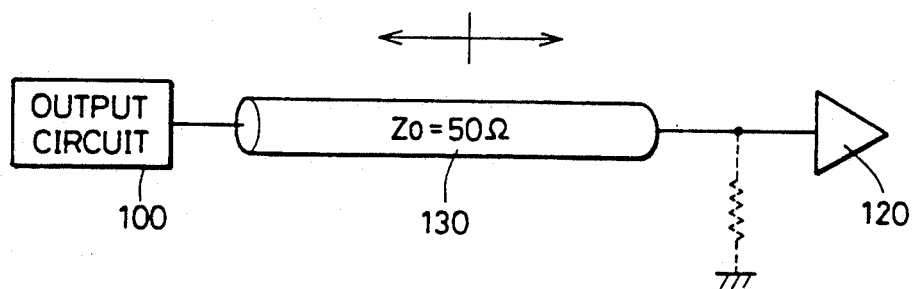
FIG. 10 is a diagram for describing the difficulties of the conventional CMOS output circuit.

FIG. 5 shows circuit simulation waveforms of data $D_{IN}$ supplied to the output circuit 1, data $D_{OUT}$ provided from the input circuit 5, and the voltage on the transmission path 3. As shown in FIG. 5, data $D_{IN}$ and data $D_{OUT}$ changes between 0 V and 5 V, and the voltage on the transmission path 3 changes between 2 V and 3 V. When the output circuit 1 shown in FIG. 2 is to be operated at high speed, Miller effect of the single transistor Q2 is likely to be a problem as will be described in the following. Referring to FIG. 6, the Miller effect will be described.

The transistor Q2 is assumed to be directly connected to the transistor 4, not through the transistor Q1 in FIG. 2. There is a parasitic capacitance $C_{GD}$ between the gate and the drain of the transistor Q2. There are also the parasitic capacitance $C_{GD}$ between the gate and the source of the transistor Q2. When the potential $V_G$ of the gate of the transistor Q2 increases, the current flowing in the transistor Q2 also increases. Consequently, a voltage drop by the resistor 4 is increased, and the potential of the node n2 is decreased. The fluctuation of the potential of the node n2 causes the potential of the gate of the transistor Q2 to fluctuate by the capacitive coupling due to the parasitic capacity $C_{GD}$. Accordingly, the waveform of the potential $V_G$ of the gate of the transistor Q2 is disturbed.

In the output circuit 1 in FIG. 2, the transistor Q1 is inserted between the transistor Q2 and the output pad 14 to suppress transmission of the fluctuation of the potential of the output pad 14, so that the effect of the parasitic capacitance $C_{GD}$ between the gate and the drain of the transistor Q2 is decreased.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An output circuit for driving a load in response to an applied signal, comprising:
    an output pad to which said load is connected thereto;
    a constant current source for supplying a constant current;
    switch means provided between said output pad and said constant current source, selectively rendered conductive or nonconductive in response to the applied signal,
    wherein said switch means comprises a first field effect element having a control terminal for receiving said applied signal; and
    a second field effect element connected between said output pad and said first field effect element, having a control terminal for receiving a prescribed potential.

2. An output circuit according to claim 1, wherein said constant current source comprises:
    constant voltage generating means for generating a constant voltage;
    bias current generating means for generating a constant bias current in response to said constant voltage; and
    a first current mirror circuit for generating a current proportional to said bias current as said constant current in response to said bias current.

3. An output circuit according to claim 2, wherein said constant voltage means comprises bandgap voltage generating means.

4. An output circuit according to claim 2,
    wherein said bias current generating means comprises an operational amplifier, resistor means, a third field effect element, and a second current mirror circuit;
    said resistor means having one end coupled to a prescribed power supply potential and the other end connected to said third field effect element;
    said operational amplifier means having one input terminal for receiving said constant voltage from said constant voltage generating means and the other input terminal connected to said the other end of said resistor means;
    said third field effect element connected between said second current mirror circuit and said resistor means, and having a control terminal for receiving an output of said operational amplifier; and
    said second current mirror circuit generating a current proportional to a current flowing in said third field effect element as said bias current.

5. An output circuit according to claim 2,
    wherein said first current mirror circuit comprises:
    a third field effect element coupled between said second field effect element and a prescribed power supply potential, having a control terminal; and
    a fourth field effect element coupled between said bias current generating means and said prescribed power supply potential, having a control terminal connected to said bias current generating means and to said control terminal of said third field effect element.

6. An output circuit according to claim 1,
    wherein said first field effect element comprises a MOS transistor; and
    said second field effect element comprises a MOS transistor.

7. An interface system comprising:
    an output circuit;
    an input circuit;
    a transmission path connected between said output circuit and said input circuit; and
    resistor means coupled between said transmission path and a prescribed potential;
    wherein said output circuit comprises:
    an output pad connected to said transmission path,
    a constant current source for supplying a constant current; and
    switch means connected between said output pad and said constant current source, selectively rendered conductive or non conductive in response to an applied signal.

8. An interface system according to claim 7,
    wherein said switch means comprises a first field effect element having a control terminal for receiving said signal;
    said output circuit further comprises:
    a second field effect element connected between said output pad and said first field effect element, having a control terminal for receiving a prescribed potential.

9. An interface system according to claim 8,
    wherein said constant current source comprises:
    constant voltage generating means for generating a constant voltage;
    bias current generating means for generating a constant bias current in response to said constant voltage; and
    a current mirror circuit for generating a current proportional to said bias current in response to said bias current as said constant current.

10. An interface system according to claim 7,
    wherein said input circuit comprises:
    an input pad connected to said transmission path;
    reference potential generating means for generating a prescribed reference potential; and
    differential amplifier means for differentially amplifying a potential difference between a potential of said input pad and said reference potential generated by said reference potential generating means.

11. An interface system according to claim 10,
    wherein said reference potential generating means comprises a constant current source for supplying a constant current and resistor means connected in series to said constant current source.

12. An interface system according to claim 10, wherein said differential amplifier means comprises a CMOS differential amplifier.

13. An interface system according to claim 7, wherein a prescribed power supply voltage is applied to said output circuit, and an amplitude of a voltage on said output pad is set lower than said power supply voltage.

14. An operating method of an output circuit for driving a resistive load in response to an applied signal comprising the steps of:
 applying a prescribed potential to one end of said resistive load,
 generating a constant current by using a constant current source, and
 electrically connecting or disconnecting said constant current source to the other end of said resistive load in response to an applied signal.

* * * * *